(12) United States Patent
Schulte et al.

(10) Patent No.: US 6,933,237 B2
(45) Date of Patent: Aug. 23, 2005

(54) SUBSTRATE ETCH METHOD AND DEVICE

(75) Inventors: Donald W. Schulte, Corvallis, OR (US); Terry McMahon, Corvallis, OR (US); Chien-Hua Chen, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 124 days.

(21) Appl. No.: 10/178,033

(22) Filed: Jun. 21, 2002

(65) Prior Publication Data

US 2003/0235991 A1 Dec. 25, 2003

(51) Int. Cl.⁷ .................................. H01L 21/302
(52) U.S. Cl. ................ 438/700; 438/706; 438/719; 438/745; 257/622
(58) Field of Search .................. 438/700, 706, 438/719, 745; 257/622

(56) References Cited

U.S. PATENT DOCUMENTS

| | | | | |
|---|---|---|---|---|
| 4,160,683 A | * | 7/1979 | Roche | 438/307 |
| 4,303,933 A | * | 12/1981 | Horng et al. | 257/514 |
| 4,333,227 A | * | 6/1982 | Horng et al. | 438/359 |
| 4,870,467 A | * | 9/1989 | Boland et al. | 257/603 |
| 4,978,639 A | * | 12/1990 | Hua et al. | 438/465 |
| 5,164,813 A | | 11/1992 | Blackstone et al. | 257/623 |
| 5,316,965 A | * | 5/1994 | Philipossian et al. | 438/424 |
| 5,531,017 A | | 7/1996 | Church et al. | 29/603.12 |
| 6,281,094 B1 | * | 8/2001 | Abiko et al. | 438/433 |
| 6,287,926 B1 | * | 9/2001 | Hu et al. | 438/306 |
| 6,316,287 B1 | * | 11/2001 | Zandman et al. | 438/113 |
| 6,656,843 B2 | * | 12/2003 | Bol | 438/694 |
| 2001/0001900 A1 | | 5/2001 | Pogge et al. | |
| 2001/0009177 A1 | | 7/2001 | Lou et al. | |
| 2001/0009298 A1 | | 7/2001 | Zandman et al. | |

* cited by examiner

*Primary Examiner*—Nadine G. Norton
*Assistant Examiner*—Lynette T. Umez-Eronini (57) ABSTRACT

The present invention provides methods and an etched substrate. In one embodiment, a method for etching a substrate is provided which comprises creating an etch hole in the substrate using a through the substrate etch and forming a junction on an interior of the etched hole for forming a semiconductor device therein.

43 Claims, 6 Drawing Sheets

SUBSTRATE ETCH METHOD AND DEVICE

BACKGROUND OF THE INVENTION

Semiconductor devices are typically fabricated within the top 5–10 um of the surface of the substrate wafer. Given this constraint, devices fabricated using typical semiconductor processes have maximum operating power limitations that are proportional to the area the device occupies on the substrate surface. Therefore, a device needing a higher overall power limit must be created either by connecting many smaller devices on the surface of the silicon wafer or by increasing the lateral area consumed by a single device. The need to expand devices laterally to increase their power handling capability leads to an ineffective use of the substrate material. A method of manufacturing a semiconductor device that optimizes the use of the substrate material is needed in order to minimize the overall dimensions of the silicon required for constructing an active device.

SUMMARY OF THE INVENTION

The present invention provides methods and an etched substrate. In one embodiment, a method for etching a substrate is provided which comprises creating an etch hole in the substrate using a through the substrate etch and forming a junction on an interior of the etched hole for forming a semiconductor device therein. In another embodiment, a substrate is provided which comprises an etched hole created using a through the substrate etch and a junction formed on an interior of the etched hole for forming a semiconductor device therein. In yet another embodiment, the method provides for etching a substrate wherein the steps of the method comprise selectively masking the substrate with a plurality of masks layered in accordance with a predetermined scheme and alternating etching and diffusing cycles to form active components, wherein at least one etching cycle is a through the substrate etch process. The method provides for etching the substrate to obtain effective use of the entire volume of the substrate.

DETAILED DESCRIPTION OF PREFERRED EMBODIMENTS

The present invention provides a method, an active semiconductor and an etched substrate wherein a technique of fabrication includes using a through the substrate etch. The use of alternating through substrate etching and diffusion cycles allows the entire surface of the substrate to be utilized efficiently.

Figure 1:
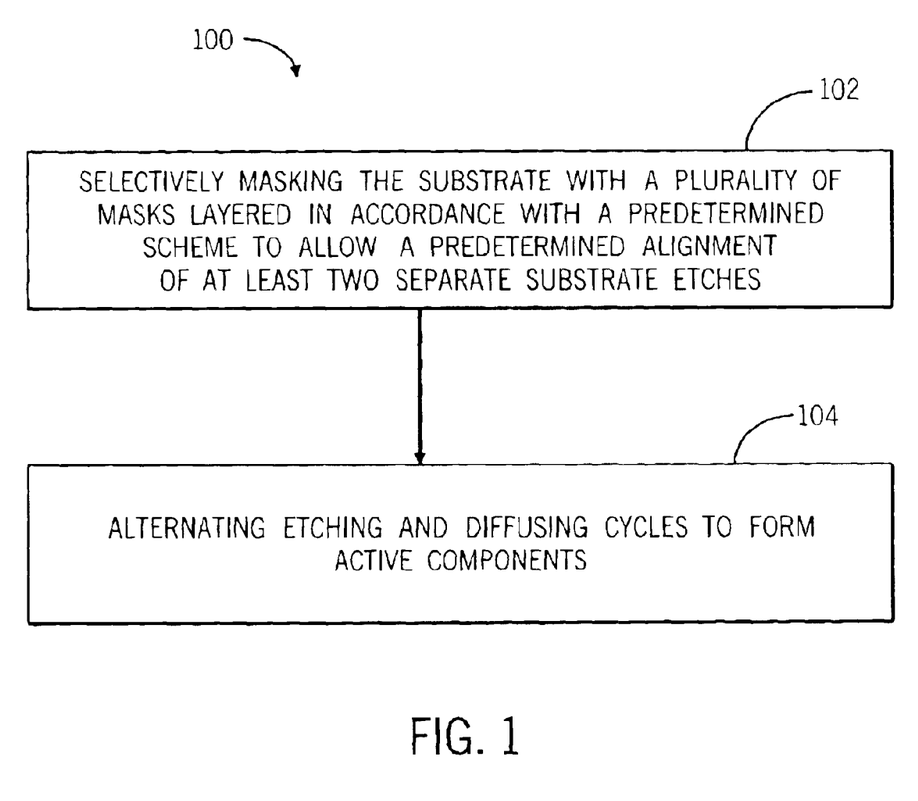
FIG. 1 shows a flow chart of a first embodiment of steps in accordance with a method of the present invention.
Figure 2:
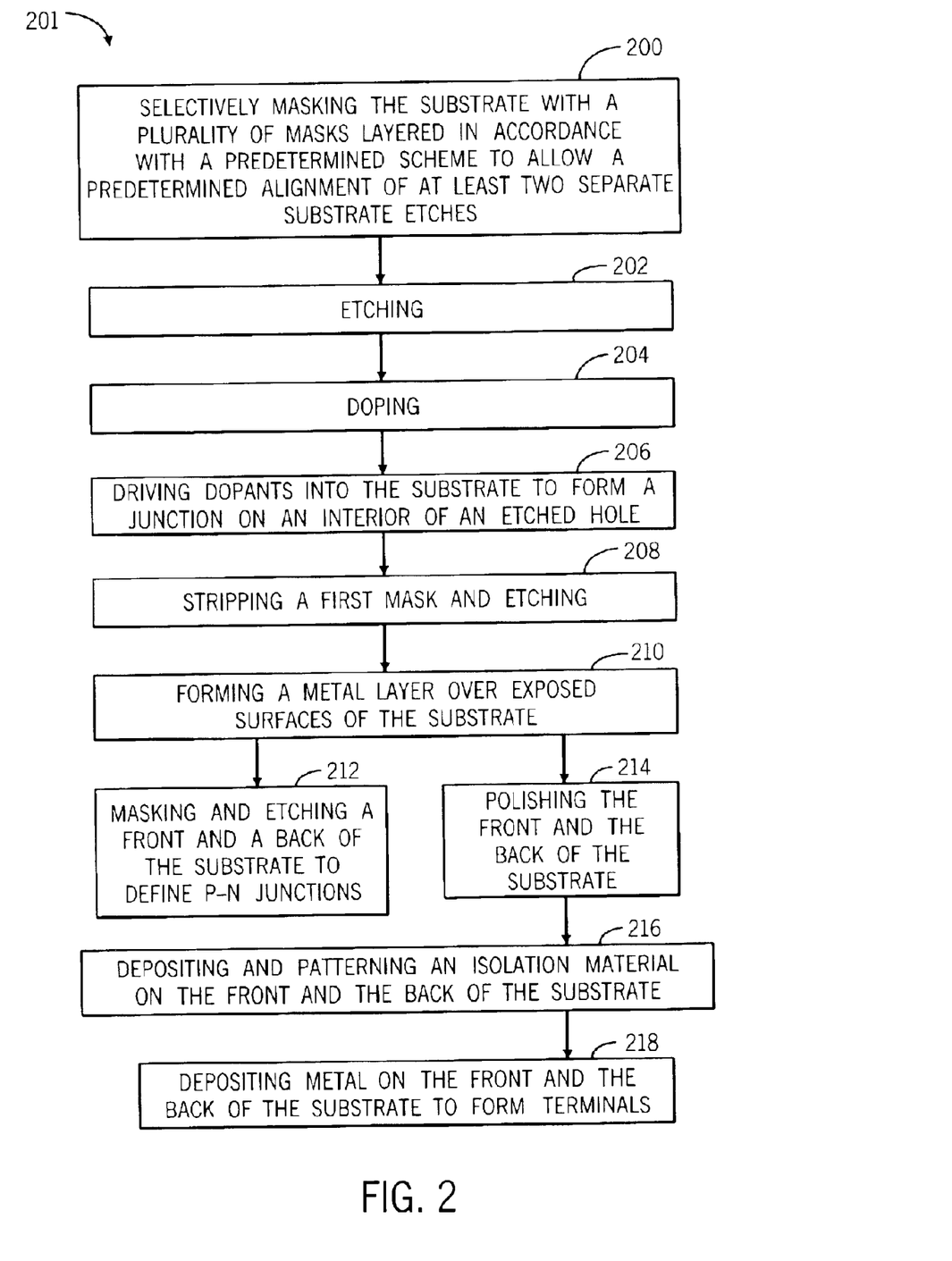
FIG. 2 shows a flow chart of a second embodiment of steps in accordance with a method of the present invention.

FIG. 1, numeral 100, shows a flow chart of a first embodiment of steps in accordance with a method of the present invention. The method for etching a double-sided substrate to obtain effective use of the substrate includes selectively masking 102 the substrate with a plurality of masks layered in accordance with a predetermined scheme to allow a predetermined alignment of at least two separate substrate etches and alternating etching and diffusing cycles 104 to form active components, wherein at least one etching cycle is a through the substrate etch process. The substrate may, for example, be silicon. Generally, the masks are offset in a predetermined fashion. As shown in FIG. 2, numeral 201, after selectively masking 200 the substrate with a plurality of masks that are layered in accordance with a predetermined scheme and after a first etching cycle 202 on the masked substrate, the substrate may be doped 204. After doping, a thermal cycle 206 is used to drive dopants into the substrate to create a semiconductive junction on the interior of the etched hold. During the thermal cycle for dopant drive in, exposed surfaces of the substrate may be oxidized. Next, a first mask may be stripped and the substrate may be etched 208. Then, a metal layer may be formed 210 over exposed surfaces of the substrate. For example, the metal layer may be formed by electroplating or by flash-coating and electroplating to fill etched holes and cover the substrate. After forming the metal layer, a front and a back of the substrate may be masked and etched 212 to define and isolate a plurality of p-n junctions.

Alternatively, after forming 210 the metal layer, a front and a back of the substrate may be polished 214. Polishing is typically accomplished by chemical mechanical planarization (CMP) or grinding until metal surfaces filling holes are substantially aligned with adjacent substrate surfaces. After polishing 214, an isolation material may then be deposited and etched 216 on the front and the back of the substrate. Generally, the pattern isolation material may be an oxide or a dielectric material. After depositing the pattern isolation material 216, metal may be deposited 218 on the front and the back of the substrate to form a first terminal on the front of the substrate and a second terminal on the back of the substrate. Where desired, silicon nitride may be used as a masking material.

The use of the present invention provides for effective use of silicon area of a silicon wafer to be increased by approximately 256 times what is currently possible using a lateral structure on the surface of the wafer. That is, assuming 2×10 micrometer slots, 10 micrometers wide, a silicon surface area consumed by implementation of the above method is approximately 100 square micrometers, and the active diode area is 2×10×675 micrometers, or 13500 square micrometers. A similar lateral diode would occupy a silicon surface area of over 160 micrometers by 160 micrometers. Thus, the effective increase in silicon usage would be a factor of 256.

FIGS. 3 through 5 show block diagrams of one embodiment of an active semiconductor component or double-sided etched substrate having a plurality of junction semiconductor devices disposed on the substrate as it is prepared in accordance with the present invention. The semiconductor component may generally be fabricated through wafer etching of a substrate to obtain effective use of substrate surfaces. Hence, the semiconductor component includes a plurality of junction semiconductor devices disposed in the substrate and prepared by selectively masking the substrate with a plurality of masks layered in accordance with a predetermined scheme and alternating etching and diffusing cycles including at least one through the substrate etch process. Generally, the substrate may be silicon, and masks may be offset to provide the desired etchings. Examples of typical junction semiconductor devices include diodes, bipolar transistors, triacs, and junction FETs.

FIG. 3 is one embodiment of a silicon substrate wherein the first four steps of FIG. 2 are implemented. In FIG. 3(a), there is shown a substrate that is selectively masked with a plurality of layers. In particular, a selectively removable first hard mask 300 formed preferably of silicon nitride is applied to a front of a silicon substrate 302. The substrate 302 is preferably n-type doped. A removable second hard mask 301 formed of silicon oxide is placed over a selected portion of the first hard mask 300. The second hard mask layer 301 is selectively etchable with respect to the first hard mask layer 300. A dielectric layer 303 is formed on the back of the silicon substrate 303.

Figure 3A:
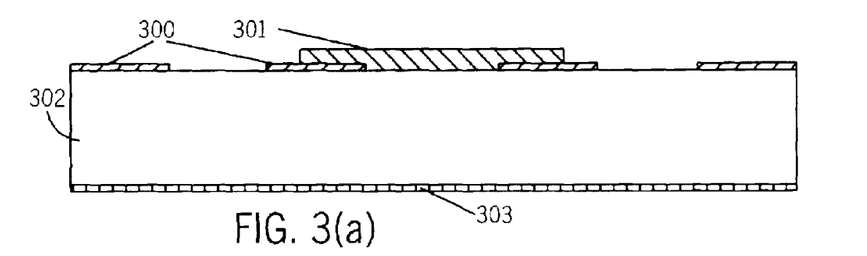
FIGS. 3–5 show block diagrams of one embodiment of an active semiconductor component or etched substrate having a plurality of junction semiconductor devices disposed on the substrate in accordance with the present invention.
Figure 3B:
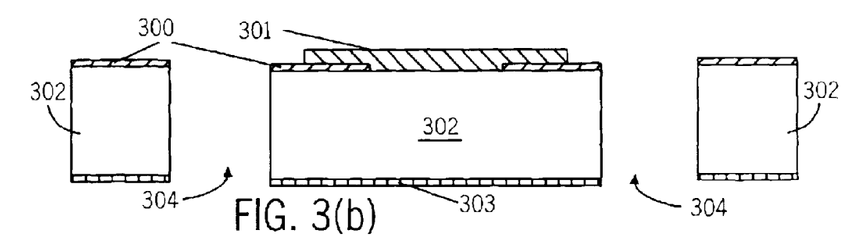
Figure 3C:
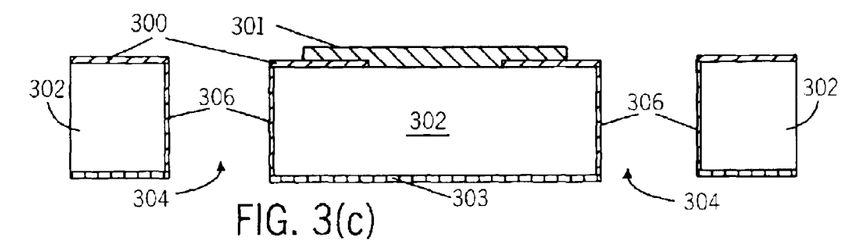
Figure 3D:
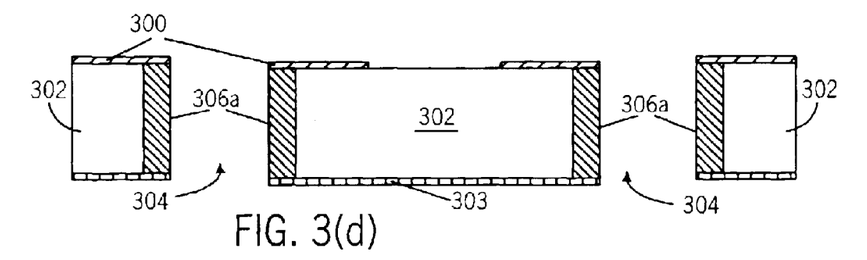

In FIG. 3(b), holes 304 are made through the substrate 302 and dielectric layer 303 using a through wafer etch with either a deep reactive ion etch ("DRIE") process or an electrochemical wet etch process. Then, a dopant 306 of opposite polarity to the substrate 302 is deposited on the interior surface of the holes 304, as shown in FIG. 3(c), using a conventional doping process which employs gas or a solid source such as Boron. Then, the entire layered sample is run through a thermal treatment to drive (i.e., diffuse and cause deeper doping penetration) the dopant 306 into the semiconductor substrate 302 and form a junction 306a. FIG. 3(d) illustrates the sample after the thermal treatment. In addition, the second hard mask 301 has been removed in preparation for the next through wafer etch.

Figure 4A:
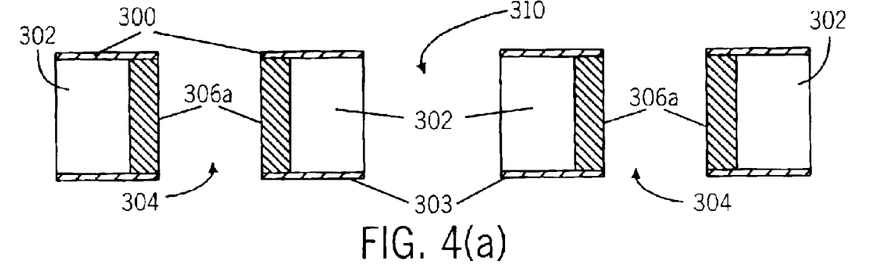
Figure 4B:
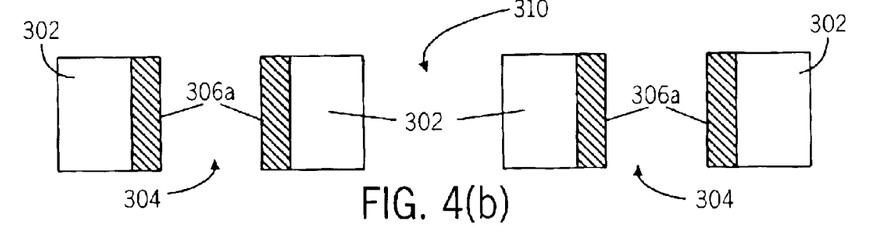
Figure 4C:
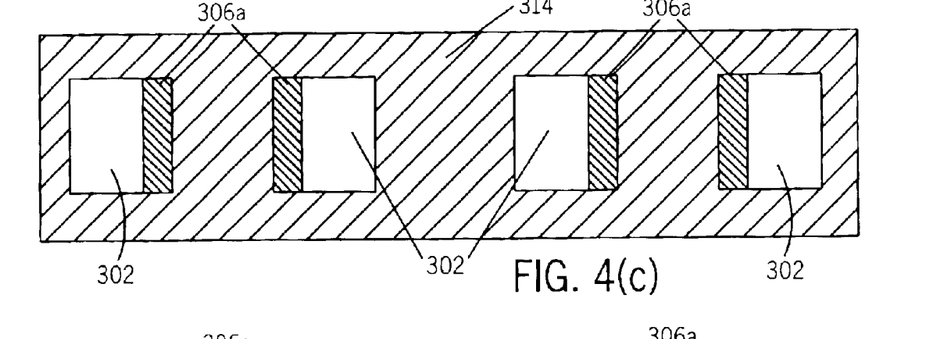
Figure 4D:
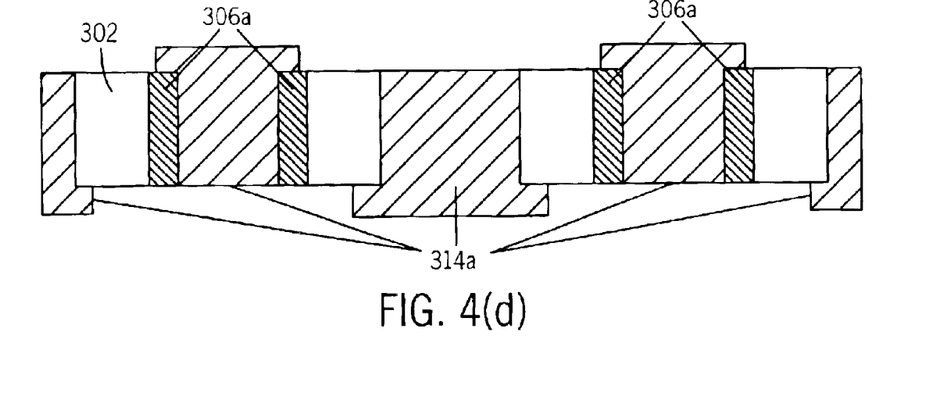
Figure 5A:
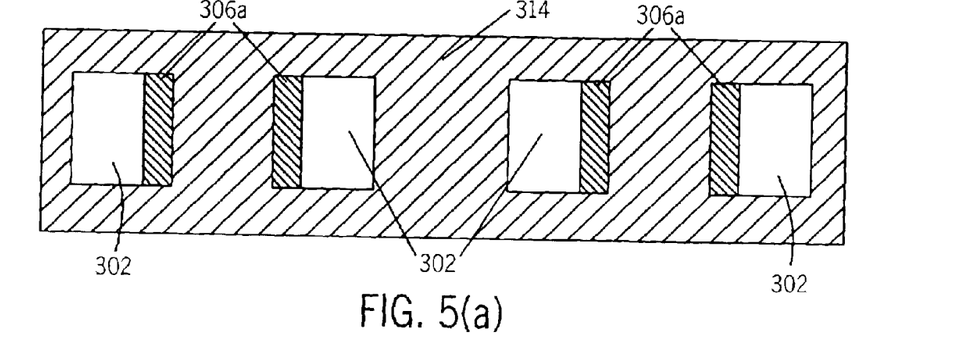
Figure 5B:
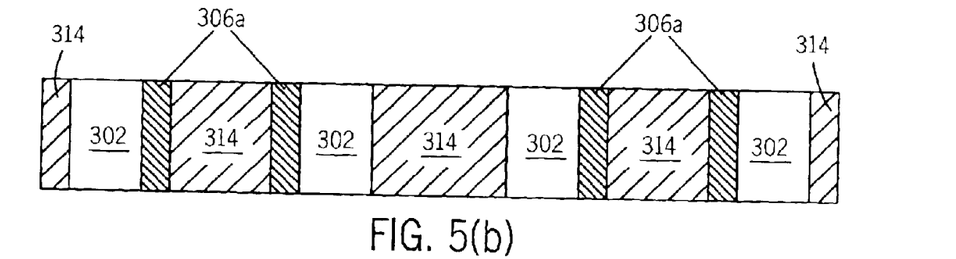
Figure 5C:
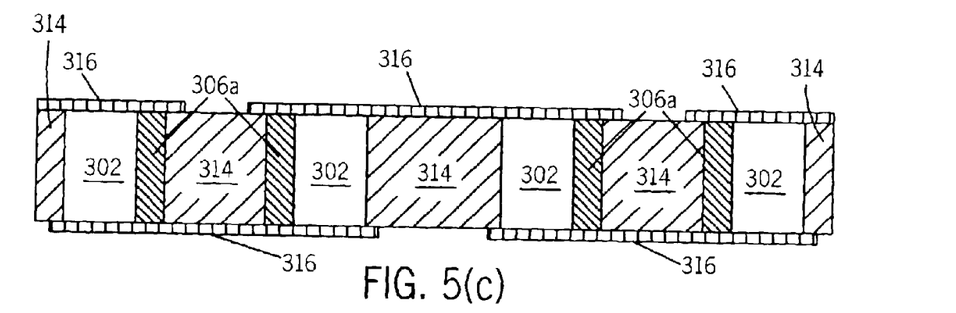
Figure 5D:
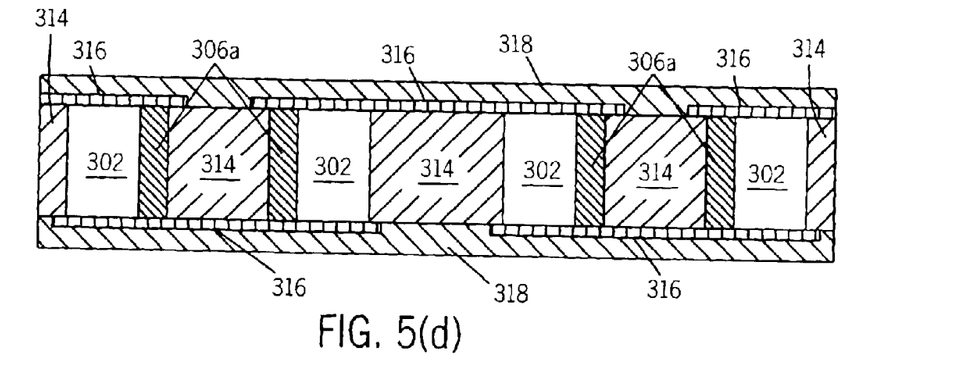

As shown in FIG. 4(a), the second hard mask 301 is stripped and a corresponding exposed portion of the silicon substrate 302 is etched to form a second set of holes 310 through the wafer. The holes 310 are automatically aligned with holes 304 as a result of the selective removal of the second hard mask 301 covering the selective region of the first hard mask 300. Then, the first hard mask 300 and dielectric layer 303 are removed, as shown in FIG. 4(b). Next, a metal layer 314 is formed over exposed surfaces of the silicon substrate 302, for example, using an electroplating process, as shown in FIG. 4(c). The electroplating process may require an initial deposition of a seed layer of metal. A front and a back of the substrate 302 may then be masked and etched to define and isolate p-n junctions to form contacts 314a. As shown in FIG. 4(d), the metal layer 314 is shown after masking and etching to form the contacts 314a.

FIG. 5 illustrates an alternative process for completion of the device after formation of metal layer 314. In particular, FIG. 5(a) a metal layer 314 is formed over exposed surfaces of the silicon substrate 302, for example, using an electroplating process, similar to the process shown in FIG. 4(c). Then, a metal layer 314 is polished to expose the front and back of the substrate 302. FIG. 5(b) shows the sample in FIG. 5(a) after CMP. Next, a dielectric layer 316 is deposited on the front and the back of the silicon substrate 302 having the metal layer 314, as shown in FIG. 5(c). This layer 316 isolates selected portions of the front and the back of the substrate 302 to allow selective contact to be made with the junction. Then a metal layer 318 is deposited on the front and the back of the substrate 302 using an electroplating process to form contacts. Again, the electroplating process may require an initial deposition of a seed layer of metal. The metal layer 318 may be alternatively deposited using plasma enhanced chemical vapor deposition (PECVD) and/or physical vapor deposition (PVD).

Figure 6:
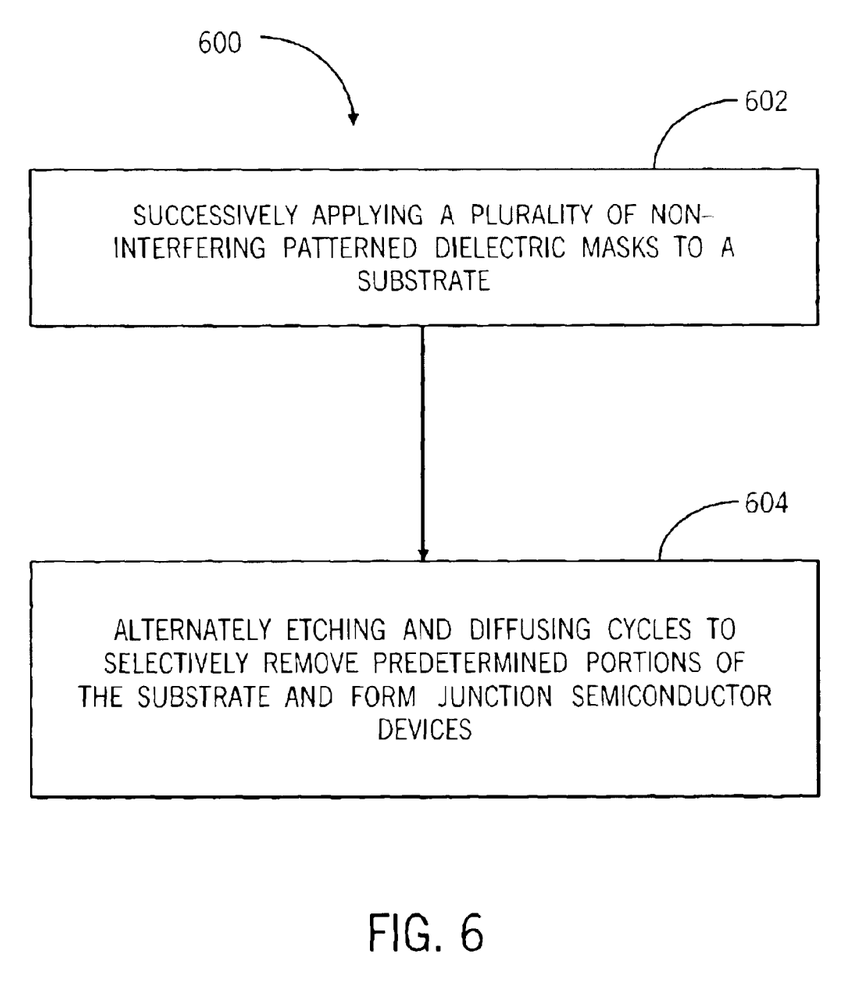
FIG. 6 shows a flow chart of a third embodiment of steps in accordance with a method of the present invention.

FIG. 6, numeral 600, shows a flow chart of a third embodiment of steps in accordance with a method of the present invention. The method provides for fabricating an active semiconductor device with efficient use of the substrate. First, a plurality of non-interfering patterned dielectric masks may be successively applied 602 to a substrate. Next, etching and diffusing cycles may be alternated 604 to selectively remove predetermined portions of the substrate and form junction semiconductor devices.

The non-interfering patterned dielectric masks may include silicon nitride. Etching may include wet and/or dry etching. Typical doping substances utilized may include diborane, phosphine, arsine, phosphorous oxychloride and solid source boron nitride. Forming the metal layer may be accomplished by electrolytic plating, electroless plating or sputtering.

Examples of junction semiconductor devices that may be fabricated using the present invention include diodes, bipolar transistors, triacs, and junction FETs. Silicon, or any other suitable material, may be used as the substrate. Masks are generally offset to provide for self-aligned etching of through wafer holes during two separate etching steps. Pattern isolation materials are typically oxides and/or dielectric materials.

The foregoing description of preferred embodiments of the invention have been presented for purposes of illustration and description. They are not intended to be exhaustive or to limit the invention to the precise form disclosed and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto and their equivalents.

What is claimed is:

1. A method for etching a substrate, comprising the steps of:

selectively masking the substrate with a plurality of masks layered in accordance with a predetermined scheme; and alternating etching and diffusing cycles to form active components, wherein at least one etching cycle forms a hole entirely through the substrate.

2. The method of claim 1 wherein the substrate is selectively masked to allow a predetermined alignment of at least two separate substrate etches.

3. The method of claim 1 wherein the substrate comprises silicon.

4. The method of claim 1 wherein the masks are offset.

5. The method of claim 1 further comprising doping the substrate, after a first etching cycle.

6. The method of claim 2 further comprising utilizing a thermal cycle, after doping, to drive dopants into the substrate to form a junction on an interior sidewall of an etched hole created by through the substrate etch process.

7. The method of claim 6 further comprising stripping a mask and etching the substrate, after forming a junction and oxidizing exposed surfaces of the substrate.

8. The method of claim 7 further comprising forming a metal layer over exposed surfaces of the substrate, after stripping the mask and etching the substrate.

9. The method of claim 8 wherein forming the metal layer is via electroplating.

10. The method of claim 8 wherein forming the metal layer is via flash-coating and electroplating to fill etched holes and cover the substrate.

11. The method of claim 8 further comprising masking and etching a front and a back of the substrate, after forming the metal layer, to define and isolate a plurality of p-n junctions.

12. The method of claim 8 further comprising polishing a front and a back of the substrate, after forming the metal layer.

13. The method of claim 12 wherein polishing is via one of: 1)chemical mechanical planarization (CMP) or 2) grinding, until surfaces of metal filling holes are substantially aligned with adjacent substrate surfaces.

14. The method of claim 12 further comprising depositing and patterning an isolation material on the front and the back of the substrate, after polishing the substrate.

15. The method of claim 14 wherein the isolation material is selected from a group consisting of an oxide and a dielectric metal.

16. The method of claim 14 further comprising depositing metal on the front and the back of the substrate, after depositing and patterning the isolation material, to form a first terminal on the front of the substrate and a second terminal on the back of the substrate.

17. The method of claim 1 wherein the masks are form of dielectric materials. Wherein dielectric material of one mask is selectively etchable with respect to dielectric material of another mask.

18. The method of claim 17, wherein the each mask is formed from at least one dielectric material selected from a group consisting of silicon nitride, silicon dioxide, and silicon carbide.

19. A method of fabricating an active semiconductor device with efficient use of the substrate, comprising the steps of:
successively applying a plurality of non-interfering patterned dielectric masks to a substrate to allow a predetermined alignment of at least two separate substrate etches; and
alternating etching and diffusing cycles to selectively remove predetermined portions of the substrate and form junction semiconductor devices.

20. The method of claim 19 wherein at least one etching cycle forms a hole that extends entirely through the substrate.

21. The method of claim 20 wherein one of the non-interfering patterned dielectric masks includes silicon nitride.

22. The method of claim 20 wherein at least one etching cycle includes wet etching.

23. The method of claim 20 wherein at least one etching cycle includes dry etching.

24. The method of claim 20 wherein at least one diffusing cycle includes doping the substrate with a dopant selected from a group consisting of: diborene, phosphine, arsine, phosphorous oxychloride and solid source boron nitride.

25. The method of claim 20, further comprising forming a metal layer over exposed surfaces of the substrate via electrolytic plating, electroless plating or sputtering.

26. The method of claim 20 wherein the junction semiconductor devices are selected from a group consisting of diodes, bipolar, transistors, triacs, and junction FETs.

27. The method of claim 20 wherein the substrate comprises silicon.

28. The method of claim 20 wherein the masks are offset relative to one another.

29. The method of claim 20 further comprising doping the substrate, after a first etching cycle.

30. The method of claim 29 further comprising utilizing a thermal cycle, after doping the substrate, to drive dopants into the substrate to form a junction on an interior sidewall of an etched hole.

31. The method of claim 30 further comprising stripping a first mask and etching the substrate, after forming a junction and oxidizing exposed surfaces of the substrate.

32. The method of claim 31 further comprising forming a metal layer over exposed surfaces of the substrate, after stripping the first mask and etching the substrate.

33. The method of claim 32 wherein forming the metal layer is via electroplating.

34. The method of claim 32 wherein forming the metal layer is via flash-coating and electroplating to fill etched holes and cover the substrate.

35. The method of claim 32 further comprising masking and etching a front and a back of the substrate, after forming the metal layer, to define and isolate a plurality of p-n junctions.

36. The method of claim 32 further comprising polishing a front and a back of the substrate, after forming the metal layer.

37. The method of claim 36 wherein polishing is via chemical mechanical planarization (CMP) or grinding until metal surfaces filling holes are substantially aligned with adjacent substrate surfaces.

38. The method of claim 36 further comprising depositing and patterning an isolation material on the front and the back of the substrate, after polishing the substrate.

39. The method of claim 38 wherein the pattern isolation material is an oxide or a dielectric material.

40. The method of claim 38 further comprising depositing metal on the front and the back of the substrate, after depositing and patterning an isolation material, to form a first terminal on the front of the substrate and a second terminal on the back of the substrate.

41. A method for efficiently fabricating a double-sided silicon substrate, comprising the steps of:
applying a selectively removable first hard mask to a front of a silicon substrate;
applying a selectively removable second hard mask over a selected portion of the first hard mask;
etching the silicon substrate;
doping the silicon substrate;
driving dopants into the substrate to form a junction on an interior of an etched hole;
stripping the second hard mask and etching a corresponding exposed portion of the silicon substrate;
stripping the first hard mask and oxide surfaces of the silicon substrate;
forming a metal layer over exposed surfaces of the silicon substrate; and
masking and etching a front and a back of the substrate to define and isolate p-n junctions.

42. A method for etching a substrate comprising:
etching a hole entirely through the substrate; and
forming a junction on an interior sidewall of the etched hole for forming a semiconductor device therein.

43. A method for efficiently fabricating a double-sided silicon substrate, comprising the steps of:
applying a selectively removable first hard mask to a front of a silicon substrate;
applying a selectively removable second hard mask over a selected portion of the first hard mask;
etching the silicon substrate;
doping the silicon substrate;
driving dopants into the substrate to form a junction on an interior of an etched hole;
stripping the second hard mask and etching a corresponding exposed portion of the silicon substrate;
stripping the first hard mask and oxide surfaces of the silicon substrate;

forming a metal layer over exposed surfaces of the silicon substrate; and polishing the front and the back of the silicon substrate having the metal layer to expose the front and the back of the substrate, depositing pattern isolation material on selected portions of the front and the back of the substrate, and depositing metal on the front and the back of the substrate to form diode contacts.

* * * * *